(12) United States Patent
Wappis et al.

(10) Patent No.: US 7,863,908 B2
(45) Date of Patent: Jan. 4, 2011

(54) CURRENT MEASUREMENT BASED ON A CHARGE IN A CAPACITOR

(75) Inventors: Herwig Wappis, Muhldorf (AT); Juergen Schaefer, Krumpendorf (DE)

(73) Assignee: Infineon Technologies AG, Neubiberg (DE)

(*) Notice: Subject to any disclaimer, the term of this patent is extended or adjusted under 35 U.S.C. 154(b) by 464 days.

(21) Appl. No.: 11/941,177

(22) Filed: Nov. 16, 2007

(65) Prior Publication Data
US 2009/0128132 A1 May 21, 2009

(51) Int. Cl.
G01R 27/26 (2006.01)
(52) U.S. Cl. .................. 324/678; 324/658
(58) Field of Classification Search ............ 324/678
See application file for complete search history.

(56) References Cited

U.S. PATENT DOCUMENTS

| 5,416,416 A * | 5/1995 | Bisher .................. 324/426 |
| 6,356,086 B1 * | 3/2002 | Cook et al. .............. 324/659 |
| 6,492,831 B2 * | 12/2002 | Hashimoto ............. 324/765 |
| 6,847,223 B2 * | 1/2005 | Nara et al. ............. 324/770 |
| 7,002,417 B2 * | 2/2006 | Maunuksela et al. ........ 331/17 |
| 7,663,382 B2 * | 2/2010 | Corulli et al. ........... 324/713 |
| 2002/0067172 A1 * | 6/2002 | Alker ................ 324/677 |
| 2004/0222803 A1 * | 11/2004 | Tartagni ............... 324/662 |
| 2007/0103172 A1 * | 5/2007 | Oh et al. ............. 324/671 |
| 2007/0103948 A1 * | 5/2007 | Patchornik ............. 363/49 |
| 2007/0182499 A1 * | 8/2007 | Wakai et al. ........... 331/135 |

FOREIGN PATENT DOCUMENTS

| DE | 10161832 | 6/2003 |
| WO | 9701885 | 1/1997 |

OTHER PUBLICATIONS

Tietze, "Halbleiter-Schaltungstechnik", 9. Auflage, Springer Verlag, Berlin 1989, pp. 320-325, 450-453 and 744-747.
German Office Action for DE 10 2008 051 414.4-35 dated Aug. 31, 2009.

* cited by examiner

Primary Examiner—Jeff Natalini
(74) Attorney, Agent, or Firm—Banner & Witcoff, Ltd.

(57) ABSTRACT

A method is provided that comprises determining an amount of a first current from an amount of a charge stored in a first capacitor. Also, an apparatus is provided that comprises a reference timer circuit configured to generate a first signal indicating an expiration of a time period, and a sense circuit comprising a first capacitor and configured to sense, responsive to the first signal, a charge stored in the first capacitor, and to generate a second signal representing the sensed charge.

16 Claims, 3 Drawing Sheets

CURRENT MEASUREMENT BASED ON A CHARGE IN A CAPACITOR

BACKGROUND

Current measurement is a measurement task which is frequently set. In automotive systems, for example, there is often the need for a current measurement, in particular for the purpose of receiving sensor information which has been modulated onto current signals or else for the purpose of detecting overload conditions in power output stages.

Known solutions usually use a resistor (shunt resistor) and an amplifier circuit which operates in continuous-time mode and is intended to amplify the current-dependent voltage drop across the resistor. The voltage drop across the resistor is often problematic and undesirable since it causes feedback to the system which provides the current to be measured. In the case of a current measurement with the aid of a so-called sense field-effect transistor (FET), in particular, a shunt resistor in the current path of the sense FET results in undesirable negative feedback which results in the sense FET and the power FET connected to the latter operating at different operating points and the current measurement thus being falsified.

One possible measure for reducing the influence of the shunt resistor may be to keep the resistance value of the shunt resistor as low as possible. In this case, the offset voltage of the amplifier needed to amplify the voltage across the shunt resistor is then the dominant cause of measurement errors. In order to keep the offset voltage of the amplifier as low as possible, bipolar transistors are often used in the input stage of the amplifier in known current measurement methods. As the integration density increases, the use of bipolar components becomes uneconomical on account of the large amount of chip area required.

There is thus a need for a current measurement method which causes a small voltage drop in the current path of the measurement current and in which the offset voltage of the amplifier used no longer has a significant effect on the accuracy of the current measurement.

SUMMARY

Various aspects are described herein. For example, some aspects are directed to a method comprising determining an amount of a first current from an amount of a charge stored in a first capacitor. As another example, an apparatus is provided that comprises a reference timer circuit configured to generate a first signal indicating an expiration of a time period, and a sense circuit comprising a first capacitor and configured to sense, responsive to the first signal, a charge stored in the first capacitor, and to generate a second signal representing the sensed charge.

These and other aspects will be described below in the Detailed Description section with reference to various illustrative embodiments.

BRIEF DESCRIPTION OF THE FIGURES

The following figures and the further description are intended to help to improve understanding of the invention. The elements in the figures should not necessarily be understood as restrictive. In the figures, identical reference symbols denote corresponding parts.

DETAILED DESCRIPTION

One example relates to a method for measuring a measurement current flowing in a current path, which method comprises: connecting a first capacitor to the current path with the aid of at least one first switch; charging the first capacitor with the measurement current, as a result of which a charge which depends on the measurement current is stored in the first capacitor; disconnecting the first capacitor from the current path after a charging time; and connecting the first capacitor to an amplifier unit which is designed to use the charge stored in the first capacitor or the capacitor voltage to generate an output signal which depends on the measurement current.

Another example relates to an apparatus for measuring a measurement current flowing in a current path, which apparatus has the following components: a first capacitor; at least one first switch; an amplifier unit; and a controller unit which is designed to connect the first capacitor to the current path with the aid of the first switch, so that a charge which depends on the measurement current is stored in the first capacitor, and which is designed to disconnect the first capacitor from the current path after a charging time and to connect it to the amplifier unit, the amplifier unit being designed to use the charge stored in the first capacitor or the capacitor voltage to generate an output signal which depends on the measurement current.

Figure 1:
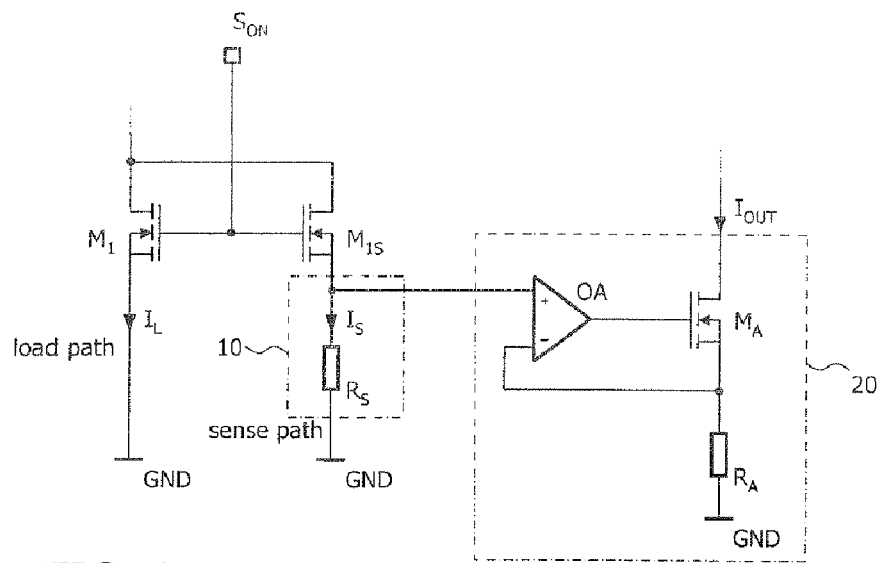
FIG. 1 shows a conventional current measurement circuit in which the current through a sense FET is measured with the aid of a shunt resistor and an amplifier connected to the latter.

FIG. 1 shows a conventional current measurement arrangement in which a measurement current $I_S$ which flows in a current path 10 is measured. A shunt resistor $R_S$ is connected to the current path in such a manner that the measurement current $I_S$ generates a voltage drop $V_S = I_S R_S$ across the shunt resistor $R_S$ which is proportional to the measurement current $I_S$. This voltage drop $I_S R_S$ is amplified with the aid of an amplifier unit 20. This amplifier unit 20 may be implemented in a different manner. In the present example, it is a current amplifier constructed with the aid of an operational amplifier OA, a transistor $M_A$ and a resistor $R_A$, the drain current $I_{OUT}$ of the transistor $M_A$ representing the output signal from the amplifier unit 20. The gain factor of the amplifier unit 20 can be set using the value of the resistor $R_A$. The value of the output current $I_{OUT}$ is proportional to the measurement current $I_S$:

$$I_{OUT} = \frac{I_S R_S}{R_A} \quad (1)$$

The measurement current $I_S$ is, for example, the source current of a so-called sense FET $M_{1S}$. In this case, the measurement current $I_S$ depends on a load current $I_L$ of a load transistor $M_1$ which is connected to the sense FET $M_{1S}$. In this case, the load transistor $M_1$ and the sense FET $M_{1S}$ have common gate and drain connections but separate source connections. The source connection of the load transistor $M_1$ is connected to an earth connection GND, while the source connection of the sense FET $M_{1S}$ is connected to the earth potential via the shunt resistor $R_S$. If the voltage drop across the shunt resistor $R_S$ is very small, the load transistor $M_1$ and the sense FET $M_{1S}$ operate at the same operating point and the measurement current $I_S$ (source current of the sense FET) is proportional to the load current $I_L$ (source current of the load transistor $M_1$), the proportionality factor corresponding to the area ratio of the active transistor areas of the load transistor $M_1$ and the sense FET $M_{1S}$. In order to keep the influence of an offset of the amplifier unit 20 low, the shunt resistor cannot be selected to be so small that the voltage drop across the shunt resistor $R_S$ is not negligibly small. In this case, the sense FET $M_{1S}$ and the load transistor $M_1$ no longer operate at the same operating point. The operating point of the sense FET $M_{1S}$ thus depends on the magnitude of the voltage drop across the shunt resistor $R_S$ and the measurement current $I_S$ is no longer exactly proportional to the load current $I_L$.

When dimensioning a current measurement arrangement according to FIG. 1, there is thus a conflict of objectives: the smaller the shunt resistor $R_S$ is selected to be, the lower the influence of the offset of the amplifier unit 20 becomes but the greater the dependence of the operating point of the sense FET $M_{1S}$ on the measurement current $I_S$ and the greater the associated error.

It goes without saying that the above-described type of current measurement is not restricted to the measurement of a measurement current provided by a sense FET but rather any desired current in any desired current path can be measured with the aid of a shunt resistor $R_S$, the consequence of the undesirable effect of the voltage drop across the shunt resistor $R_S$, which is associated with the measurement, not being able to be reduced as desired on account of the influence of the amplifier offset.

Figure 2:
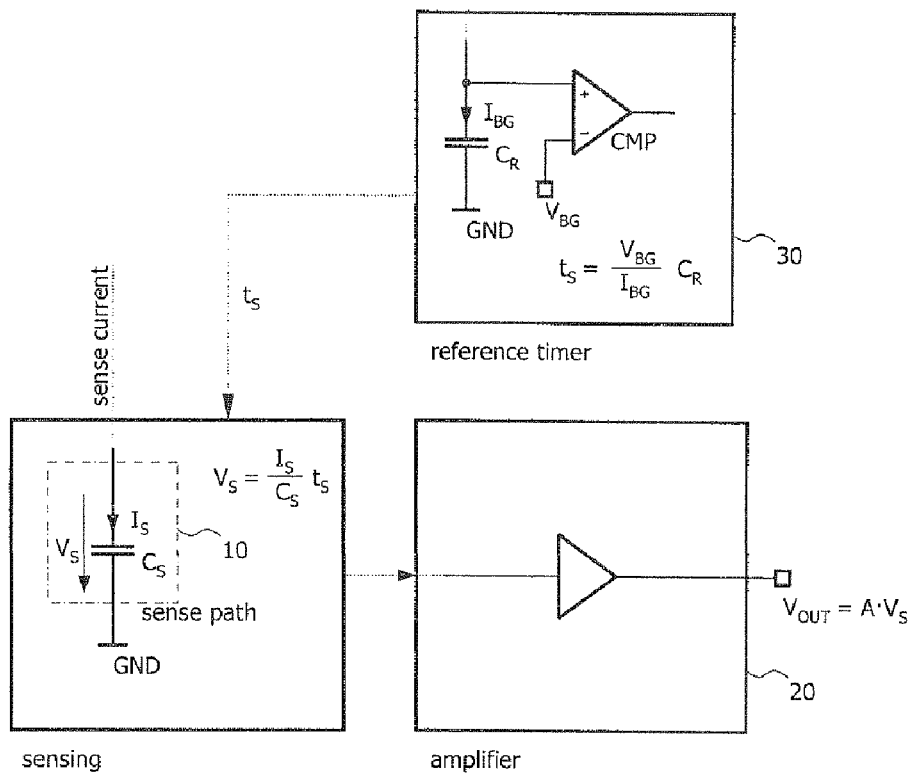
FIG. 2 shows, as one example of an embodiment, a current measurement circuit in which a capacitor is charged with the measurement current and the capacitor charge or the capacitor voltage is then evaluated. A reference timer is provided for the purpose of determining the charging time.

FIG. 2 illustrates an example of an embodiment in which, on the one hand, the offset of the amplifier unit 20 no longer plays a role and, on the other hand, only a very small voltage drop is caused in the current path of the measurement current $I_S$, as a result of which the operating point of the sense FET only depends on the measurement current $I_S$ to a very slight extent.

Instead of the shunt resistor $R_S$, a measurement capacitor $C_S$ is connected to the current path 10 in the present example in such a manner that it is charged by the measurement current $I_S$ for a charging time $t_S$. The voltage across the measurement capacitor $C_S$ is denoted using the symbol $V_S$. The measurement capacitor $C_S$ is not permanently charged but rather only during the charging time $t_S$. Charging of the measurement capacitor $C_S$ is then stopped and the instantaneous capacitor voltage $V_S$ is amplified with the aid of an amplifier unit 20. The amplified signal is available for further processing at an output of the amplifier unit 20 in the form of an output voltage $V_{OUT}$. The amplifier unit 20 has an operating gain A. The output voltage $V_{OUT}$ can then be calculated as follows:

$$V_{OUT} = A \cdot \frac{I_S t_S}{C_S} \quad (2)$$

where the product $I_S t_S$ is the charge stored in the capacitor $C_S$.

As can be seen from equation (2), the accuracy of the output voltage $V_{OUT}$ depends directly on the accuracy of the charging time $t_S$, that is to say an error in the charging time $t_S$ has a direct effect on the output voltage $V_{OUT}$. For a more precise measurement, it may thus be desirable to precisely prescribe the charging time $t_S$.

In the present example, the charging time $t_S$ is prescribed by a reference timer 30. The reference timer comprises at least one reference capacitor $C_R$, which is charged with a temperature-stabilized reference current $I_{BG}$, and a comparator CMP which is designed to compare the resultant voltage across the capacitor $C_R$ with a temperature-stabilized reference voltage $V_{BG}$. The reference current $I_{BG}$ and the reference voltage $V_{BG}$ may be generated, for example, with the aid of a bandgap reference circuit. Provided that the reference capacitor is initially discharged, the charging time $t_S$ ends at the time at which the capacitor voltage reaches the value of the reference voltage $V_{BG}$. The charge stored in the reference capacitor $C_R$ is equal to $I_{BG} t_S = V_{BG} C_R$ at the time $t_S$. The charging time $t_S$ follows from this:

$$t_S = \frac{V_{BG} C_R}{I_{BG}} \quad (3)$$

By inserting equation (3) into equation (2), the following results for the output voltage $V_{OUT}$:

$$V_{OUT} = I_S \cdot \frac{V_{BG}}{I_{BG}} \cdot \frac{C_R}{C_S} \cdot A \quad (4)$$

It can be seen from equation (4) that, in the present example, the output voltage $V_{OUT}$ depends only on the reference current $I_{BG}$, the reference voltage $V_{BG}$, the gain factor A of the amplifier unit 20 and the ratio of the capacitances $C_R$ and $C_S$. The achievable accuracy of the output voltage $V_{OUT}$ thus depends on the capacitance ratio $C_R/C_S$ and on the gain factor A.

Figure 3:
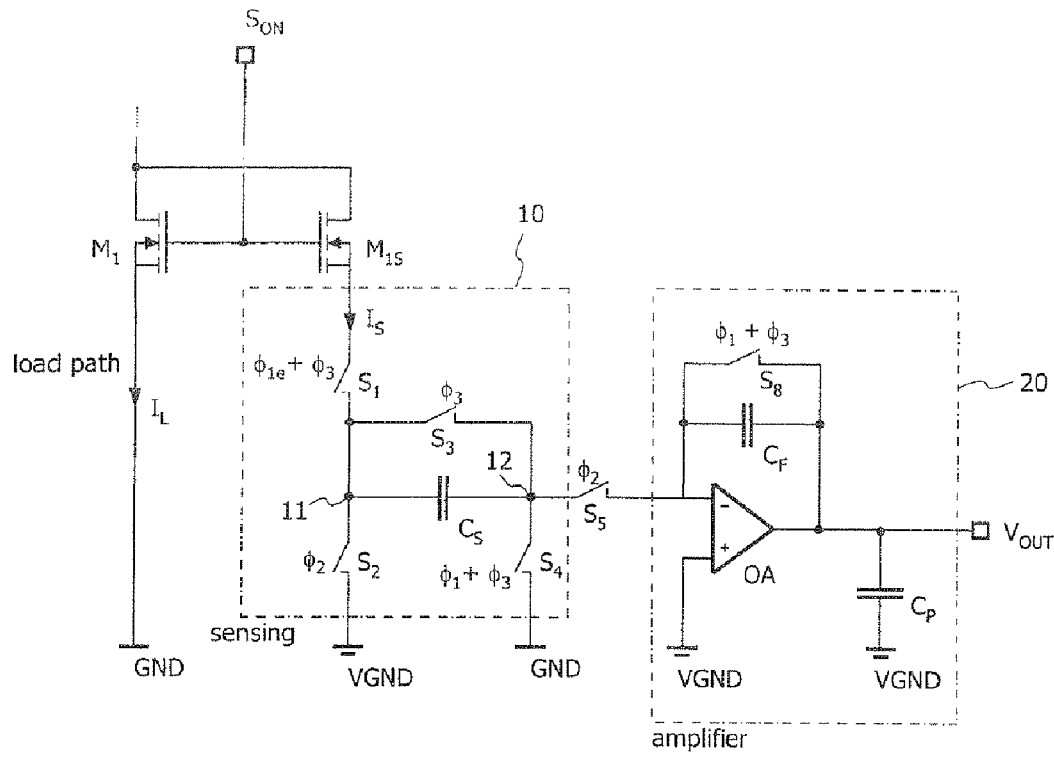
FIG. 3 shows an example of an implementation of the example from FIG. 2.

FIG. 3 shows one example of an implementation of the measurement principle described using FIG. 2. The measurement current $I_S$ is provided by the sense FET $M_{1S}$, the sense FET $M_{1S}$ being connected to the load transistor $M_1$ in such a manner that the source current of the sense FET $M_{1S}$ (measurement current $I_S$) is proportional to the source current of the load transistor $M_1$ (load current $I_L$). The measurement principle which was described using FIG. 2 and is intended to measure the measurement current $I_S$ can be implemented in this case with the aid of "switched capacitor" technology. In this case, the source connection of the sense FET $M_{1S}$ is connected to a first connection 11 of a measurement capacitor $C_S$ by means of a first switch $S_1$. A second connection 12 of the measurement capacitor $C_S$ is connected to a first earth potential GND by means of a fourth switch $S_4$, with the result that the measurement capacitor $C_S$ is charged by the measurement current $I_S$ provided by the sense FET when the switches $S_1$ and $S_4$ are closed. The switches $S_1$ and $S_4$ must thus be closed at least during the charging time $t_S$. After the charging time $t_S$ has elapsed, the voltage $V_S = I_S t_S / C_S$ across the capacitor $C_S$ or the charge $I_S t_S$ stored in the capacitor $C_S$ is a measure of the measurement current $I_S$.

In order to evaluate the voltage $V_S$ across the measurement capacitor $C_S$ or the charge stored in the measurement capacitor, the switches $S_1$ and $S_4$ are open and the first connection 11 of the measurement capacitor $C_S$ is connected to a second earth potential VGND by means of a second switch $S_2$ and the second connection 12 of the measurement capacitor $C_S$ is connected to an input of the amplifier unit 20 by means of a fifth switch $S_5$. In order to evaluate the capacitor voltage or the capacitor charge of the measurement capacitor $C_S$, the switches $S_2$ and $S_5$ are closed in order to connect the measurement capacitor $C_S$ to the amplifier unit 20.

In the case illustrated in FIG. 3, the amplifier unit 20 is a simple charge amplifier which is formed from an operational amplifier OA whose feedback is formed by a capacitor $C_F$. The output voltage of the operational amplifier OA is buffered with the aid of a further capacitor $C_P$. The gain factor $A=V_{OUT}/V_S$ is calculated as follows:

$$A = \frac{V_{OUT}}{V_S} = \frac{C_S}{C_P} \quad (5)$$

The output voltage $V_{OUT}$ which represents the measurement current $I_S$ is directly obtained by inserting equation (5) into equation (4):

$$V_{OUT} = I_S \cdot \frac{V_{BG}}{I_{BG}} \cdot \frac{C_R}{C_F} \quad (6)$$

It is notable that the output voltage $V_{OUT}$ only depends on the reference current $I_{BG}$, the reference voltage $V_{BG}$ and the capacitance ratio of the capacitors $C_R$ and $C_F$.

In addition to the switches which have already been described, a further switch $S_3$ which is connected in parallel with the measurement capacitor $C_S$ is also utilized in order to be able to discharge the capacitor at the beginning of the operation of charging the measurement capacitor $C_S$. The feedback capacitor $C_F$ may also be initialized, that is to say discharged, before the amplifier unit is coupled to the measurement capacitor $C_S$ by means of the switch $S_5$. This can be achieved, for example, with the aid of a switch $S_8$ which is connected in parallel with the capacitor $C_F$. The exact switching sequence of the switches $S_1$ to $S_5$ is explained in more detail further below using FIG. 5.

Figure 4:
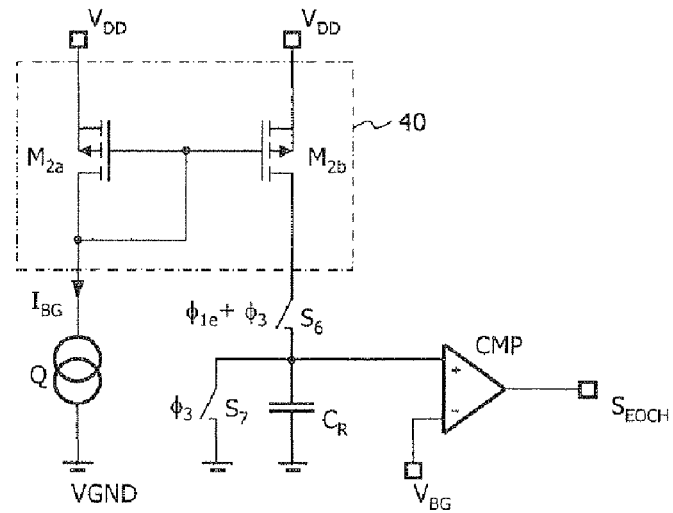
FIG. 4 shows a more detailed example of the reference timer from FIG. 2.

FIG. 4 shows one example of the implementation of the reference timer from FIG. 2. The reference timer comprises a current mirror 40 comprising two transistors $M_{2a}$ and $M_{2b}$. The drain current of the transistor $M_{2a}$ corresponds to the reference current $I_{BG}$ which is generated by a current source Q, for example. The drain current of the transistor $M_{2b}$ is "mirrored", with the result that the drain current $I_R$ of the transistor $M_{2b}$ is proportional to the reference current $I_{BG}$. The current mirror 40 is connected to a first connection of a reference capacitor $C_R$ by means of a sixth switch $S_6$ in such a manner that the reference capacitor can be charged by the drain current $I_R$ of the second transistor $M_{2b}$. A seventh switch $S_7$ which is connected in parallel with the reference capacitor $C_R$ is used to discharge the reference capacitor $C_R$. When the switch $S_6$ is closed, the reference capacitor $C_R$ is charged as soon as the seventh switch $S_7$ is open. A comparator CMP detects when the capacitor voltage reaches the reference voltage $V_{BG}$ and signals this at its output by means of a corresponding logic signal $S_{EOCH}$. The charging time $t_S$ thus begins at the time at which the switch $S_7$ is opened and ends at the time at which the capacitor voltage across the reference capacitor $C_R$ reaches the reference voltage $V_{BG}$, which is signalled by means of a corresponding signal $S_{EOCH}$ at the output of the comparator CMP.

Figure 5:
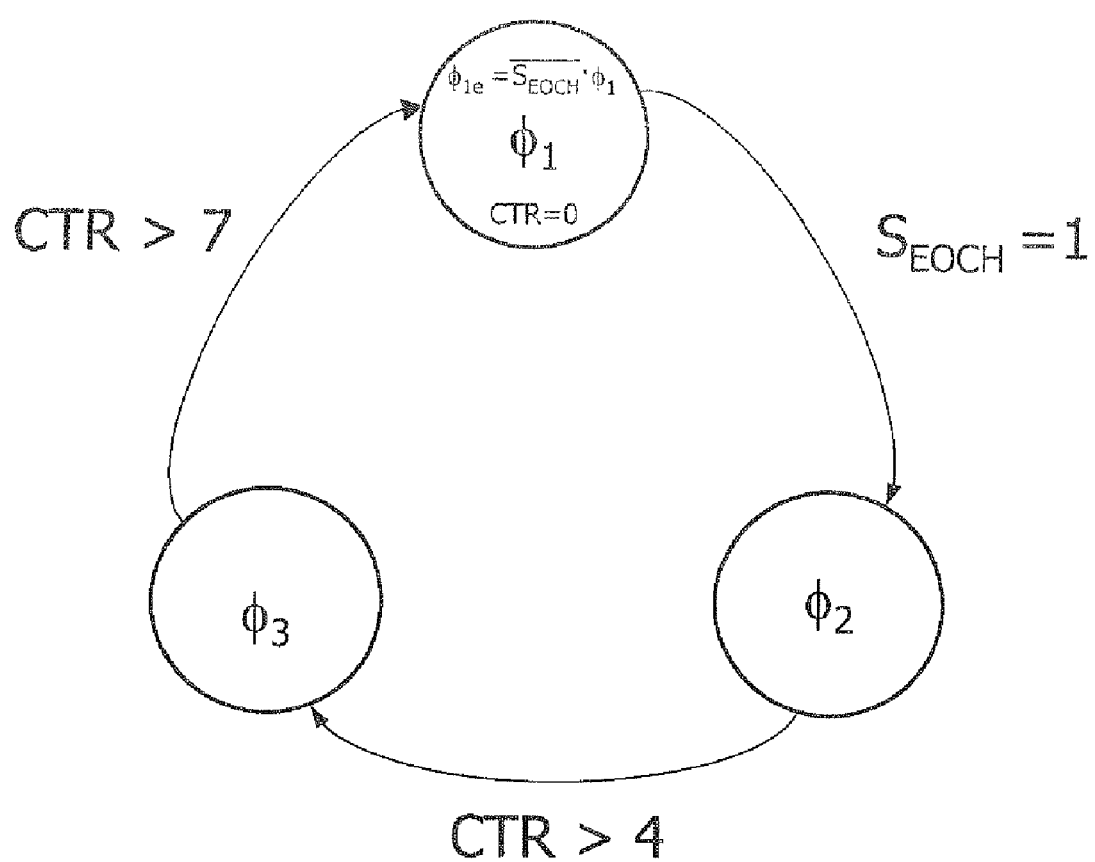
FIG. 5 shows examples of the states of a control unit which is implemented in the form of a state machine and is intended to control the current measurement circuit from FIG. 3.

The method of operation of the circuits illustrated in FIGS. 3 and 4 is explained below using the diagram illustrated in FIG. 5. The operation of switching the switches $S_1$ to $S_7$ from FIGS. 3 and 4 is controlled by a control unit (not illustrated) which is clocked using a fixed clock signal. This control unit may be implemented, for example, in the form of a state machine in a microprocessor core.

The state machine essentially has three states $\Phi_1$, $\Phi_2$ and $\Phi_3$, the measurement capacitor $C_S$ being charged in the state $\Phi_1$, the capacitor charge or the capacitor voltage of the measurement capacitor $C_S$ being evaluated in the state $\Phi_2$, and the measurement capacitor $C_S$ being "reinitialized", that is to say discharged, in the state $\Phi_3$. The reference timer from FIG. 4 is also controlled by the state machine. The reference capacitor $C_R$ is charged in the state $\Phi_1$ and is reinitialized or discharged in the state $\Phi_3$. In FIGS. 3 and 4, the switches $S_1$ to $S_7$ are indicated with those states of the state machine in which they are closed. The state $\Phi_1$ is thus also indicated as the state $\Phi_{1e}$ as long as the output signal $S_{EOCH}$ from the comparator CMP (cf FIG. 4) signals that the voltage across the reference capacitor $C_R$ has not yet reached the reference voltage $V_{BG}$ ($S_{EOCH}=0$). The following table clearly illustrates the switch positions in the individual states of the state machine, "0" symbolizing an open switch and "1" symbolizing a closed switch.

| | Switch | | | | | | | |
|---|---|---|---|---|---|---|---|---|
| State | $S_1$ | $S_2$ | $S_3$ | $S_4$ | $S_5$ | $S_6$ | $S_7$ | $S_8$ |
| $\Phi_1$ (charge) | $\overline{S_{EOCH}}$ | 0 | 0 | 1 | 0 | $\overline{S_{EOCH}}$ | 0 | 1 |
| $\Phi_2$ (amplify) | 0 | 1 | 0 | 0 | 1 | 0 | 0 | 0 |
| $\Phi_3$ (reinitialize) | 1 | 0 | 1 | 1 | 0 | 1 | 1 | 1 |

As already mentioned, the state machine is clocked using a clock signal. As soon as the output signal $S_{EOCH}$ from the comparator signals the end of the operation of charging the reference capacitor $C_R$, the state machine changes from the state $\Phi_1$ into the state $\Phi_2$ ("amplify") with the subsequent synchronous clock edge of the system clock. After a particular amount of time has elapsed, the machine changes into the state $\Phi_3$ ("reinitialize"). After a further prescribed period of time, the cycle is ended and the machine changes into the state $\Phi_1$ ("charge") again. The times at which the machine changes from the state $\Phi_2$ into the state $\Phi_3$ and from the state $\Phi_3$ into the state $\Phi_1$ can be defined, for example, by a counter CTR which is set to zero in the state $\Phi_1$ and is incremented upon each clock edge in the states $\Phi_2$ and $\Phi_3$. In the present example, the machine changes from the state $\Phi_2$ into the state $\Phi_3$ with the fifth clock edge (CTR>4) and changes from the state $\Phi_3$ into the state $\Phi_1$ with the eighth clock edge (CTR>7).

The invention claimed is:

1. A method, comprising determining an amount of a first current from an amount of a charge stored in a first capacitor, wherein determining comprises:
   charging the first capacitor with the first current; and
   measuring the amount of the charge stored in the first capacitor as a result of the charging;
   charging a second capacitor with a second current;
   comparing a voltage across the second capacitor with a reference voltage; and
   disconnecting the first capacitor from the first current responsive to the voltage across the second capacitor reaching the reference voltage,
   wherein measuring is performed while the first capacitor is disconnected from the first current.

2. The method of claim 1, wherein determining further comprises determining an amount of charging time, and charging comprises charging the first capacitor for the charging time.

3. The method of claim 2, wherein determining further comprises disconnecting the first capacitor from the first current at an expiration of the charging time.

4. The method of claim 1, further comprising fully discharging the second capacitor prior to charging the second capacitor.

5. The method of claim 1, further comprises converting the measured amount of the charge stored in the first capacitor into a multi-bit digital value.

6. The method of claim 1, further comprises fully discharging the first capacitor.

7. An apparatus for determining an amount of a first current, the apparatus comprising:
a first capacitor;
a second capacitor;
a first switch;
a control unit configured to control the first switch to selectively connect and disconnect the first capacitor from a first current;
a second switch, wherein the control unit is further configured to control the second switch to selectively connect and disconnect the second capacitor from the second current, and to control the first switch to disconnect the first capacitor from the first current depending upon a voltage formed across the second capacitor; and
a measurement unit configured to measure a charge across the first capacitor after the first capacitor is disconnected from the first current and to generate an output signal based on the measured charge.

8. The apparatus of claim 7, wherein the measurement unit comprises an amplifier having a pair of inputs connected across the capacitor.

9. The apparatus of claim 7, further comprising a comparator configured to compare the voltage across the second capacitor with a reference voltage, wherein the control unit is further configured to control the first switch responsive to an output of the comparator.

10. The apparatus of claim 9, wherein the control unit is further configured to control the first switch to disconnect the first capacitor from the first current responsive to the output of the comparator indicating that the voltage across the second capacitor has reached the reference voltage.

11. The apparatus of claim 7, further comprising an analog-to-digital converter configured to convert the output signal to a multi-bit digital signal.

12. The apparatus of claim 7, wherein the control unit is further configured to fully discharge the first capacitor.

13. A method, comprising:
charging a first capacitor with a measurement current;
charging a second capacitor with a reference current to form a voltage across the second capacitor;
comparing the voltage across the second capacitor with a reference voltage;
disconnecting the first capacitor from the current path responsive to the voltage across the second capacitor reaching the reference voltage;
connecting the disconnected first capacitor to a measurement unit; and
generating, by the measurement unit, an output signal based on a charge stored in the first capacitor.

14. The method of claim 13, wherein the measurement unit comprises an amplifier.

15. A method, comprising:
charging, for a charging time, a first capacitor with a measurement current;
charging a second capacitor with a reference current to form a voltage across the second capacitor, wherein the charging time depends upon an amount of time taken for the voltage across the second capacitor to reach a reference voltage;
disconnecting the first capacitor at the end of the charging time;
connecting the disconnected first capacitor to a measurement unit; and
generating, by the measurement unit, an output signal based on a charge stored in the first capacitor.

16. The method of claim 15, wherein the measurement unit comprises an amplifier.

* * * * *